(12) United States Patent
Wang et al.

(10) Patent No.: US 7,880,251 B2
(45) Date of Patent: Feb. 1, 2011

(54) STRUCTURE HAVING NANOAPERTURES

(75) Inventors: Shih-Yuan Wang, Palo Alto, CA (US);
Alexandre M. Bratkovski, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 769 days.

(21) Appl. No.: 11/789,821

(22) Filed: Apr. 26, 2007

(65) Prior Publication Data

US 2009/0015838 A1 Jan. 15, 2009

(51) Int. Cl.
*H01L 27/14* (2006.01)
*H01L 31/00* (2006.01)

(52) U.S. Cl. ........................ 257/431; 257/440

(58) Field of Classification Search ......... 257/292–294, 257/431–466, E31.066, E33.046
See application file for complete search history.

(56) References Cited

U.S. PATENT DOCUMENTS 6,545,329 B1 * 4/2003 Lannon et al. .............. 257/414
7,170,142 B2   1/2007 Wojcik et al.
2005/0087673 A1 * 4/2005 Chen et al. ................ 250/214.1

OTHER PUBLICATIONS

Barnes, W.L. et al., "Surface Plasmon Subwavelength Optics", Nature Publishing Group, vol. 424, Aug. 2003.
Ebbesen, T.W. et al., "Extraordinary Optical Transmission Through Sub-Wavelength Hole Arrays", Macmillan Publishers Ltd, vol. 391, Feb. 1998.
Genet, C. et al., "Light in Tiny Holes", Nature Publishing Group, vol. 445, Jan. 2007.
Hellemans, A., "Nanoholes Permit Remarkable Light Transmission", IEEE Spectrum, Jul. 2004.
Hochberg, M. et al., "Integrated Plasmon and Dielectric Waveguides", Optics Express, vol. 12, No. 22, Nov. 2004.
Lezec, H.J. et al., "Beaming Light from a Subwavelength Aperture", Science, vol. 297, Aug. 2002.
Radulovic, K. et al., "Electromagnetic Progation Through Subwavelength Hole or Slit Arrays in Thick Metal Layer Covered with Dielectric Nanofilm", TELFOR Nov. 2006.

* cited by examiner

*Primary Examiner*—Cuong Q Nguyen

(57) ABSTRACT

A structure includes a film having a plurality of nanoapertures. The nanoapertures are configured to allow the transmission of a predetermined subwavelength of light through the film via the plurality of nanoapertures. The structure also includes a semiconductor layer in connection with the film to facilitate the detection of the predetermined subwavelength of light transmitted through the film.

16 Claims, 6 Drawing Sheets

STRUCTURE HAVING NANOAPERTURES

BACKGROUND

Recently, optical detectors and waveguides have garnered increased attention for a variety of applications. One application is the transmission of information on computer chips. The trend is toward using wavelength division multiplexing (WDM) to transmit data in an optical system. WDM is a technology which multiplexes multiple optical carrier signals on a single optical fiber by using different wavelengths, i.e., different colors of light, to carry different signals. This allows for a multiplication in capacity, in addition to making it possible to perform bidirectional communications over one strand of fiber. Optical detectors that may be used for WDM systems have the ability to sense the presence of light. However, conventional optical detectors are generally wavelength insensitive for radiation with photon energy exceeding bandgap, or the energy difference between the top of the valence band and the bottom of the conduction band for the same electron quasimomentum. Thus, due to the limitations of conventional optical detectors and other components of the conventional optical transmission system, such as modulators, nano-wavelengths of light may not be used for the transmission of information.

One form of optical detectors, Schottky barrier detectors, typically include a semiconductor, such as silicon, or any III-V material such as GaAs, InP, AlGaAs, InGaAsP, GaN, InGaN, with an over-lying Schottky electrode. The interface between the semiconductor and the Schottky electrode is known as the Schottky energy barrier. In a Schottky detector, electron-hole pairs are generated in the semiconductor by the incident photons when light impinges onto the detector. As the electron-hole pairs are swept from the semiconductor by a built-in field that is reverse-biased, a photo current is generated in the external circuit. Therefore, while Schottky detectors can detect light that has a photon energy above bandgap, they are generally wavelength insensitive for above bandgap radiation. That is, they lack the ability to detect particular wavelengths of light. Instead, they only provide an indication that light is present, without determining which wavelength of the light is present.

While Schottky barrier detectors have been employed successfully as optical detectors, they are not wavelength selective. Conventional optical detectors, including Schottky barrier detectors, suffer from several other drawbacks as well. First, conventional optical detectors incorporating wavelength selectivity are relatively difficult to fabricate; the wavelength selectivity is usually accomplished by the addition of interference filters that require tens to hundreds of nanometers of precision dielectric or semiconductor layers. This is a very limiting factor in applications where space is a premium or the need for low cost, such as applications for computer chips. Second, the fabrication of conventional optical detectors and waveguides is a very complex process. Fabricating these structures requires excessive time and expense.

BRIEF DESCRIPTION OF THE DRAWINGS

Features of the present invention will become apparent to those skilled in the art from the following description with reference to the figures, in which.

DETAILED DESCRIPTION

For simplicity and illustrative purposes, the present invention is described by referring mainly to exemplary embodiments. In the following description, numerous specific details are set forth in order to provide a thorough understanding of the embodiments. It will be apparent, however, to one of ordinary skill in the art, that the embodiments may be practiced without limitation to these specific details. In other instances, well known methods and structures have not been described in detail so as not to unnecessarily obscure the embodiments.

Embodiments of structures and methods for detecting and modulating wavelengths of light are disclosed herein. The structures include a film having a plurality of nanoapertures, which are openings through the film configured to allow subwavelengths of light to be transmitted through the film. Subwavelengths of light are predetermined wavelengths of light ranging from 10 to 2000 nanometers (nm). Subwavelengths of light may refer to a specific wavelength, such as 436 nm, for example, or may also refer to narrow bands of wavelengths, such as 370-475 nm, for example. While specific wavelengths are provided in these examples, a person having ordinary skill in the art will appreciate that subwavelengths of light may refer to other subwavelengths. Also, the nanoapertures may be configured to allow for the transmission of any predetermined subwavelengths of light through the film.

The structures described herein also include a semiconductor layer in connection with the film. For example, a surface of the semiconductor layer may be in direct contact with a surface of the film. The juxtaposition of the film and the semiconductor layer forms a Schottky contact and, when reverse-biased, the film has a negative potential with respect to the semiconductor layer for n-type semiconductor. When light is directed towards the film, the predetermined subwavelengths of light may pass through the nanoapertures and into the semiconductor layer. The light transmitted through the film may be detected in the semiconductor layer to determine that a particular wavelength of light is present.

The structures and methods described herein allow for a photodetector and photodetection with several advantages over previous optical detectors. For example, the photodetectors described herein are highly wavelength sensitive. That is, the nanoapertures are configured to transmit only predetermined subwavelengths of light. Thus, when light is detected at the semiconductor layer, the precise wavelength of the light is automatically known with a high degree of accuracy, as will be discussed in greater detail below. The structures described herein are very compact. Therefore, a large number of photodetectors may be placed on small surfaces, such as computer chips. The structures described herein are also relatively easy to manufacture, because they require only a minimal number of different layers and materials.

Figure 1A:
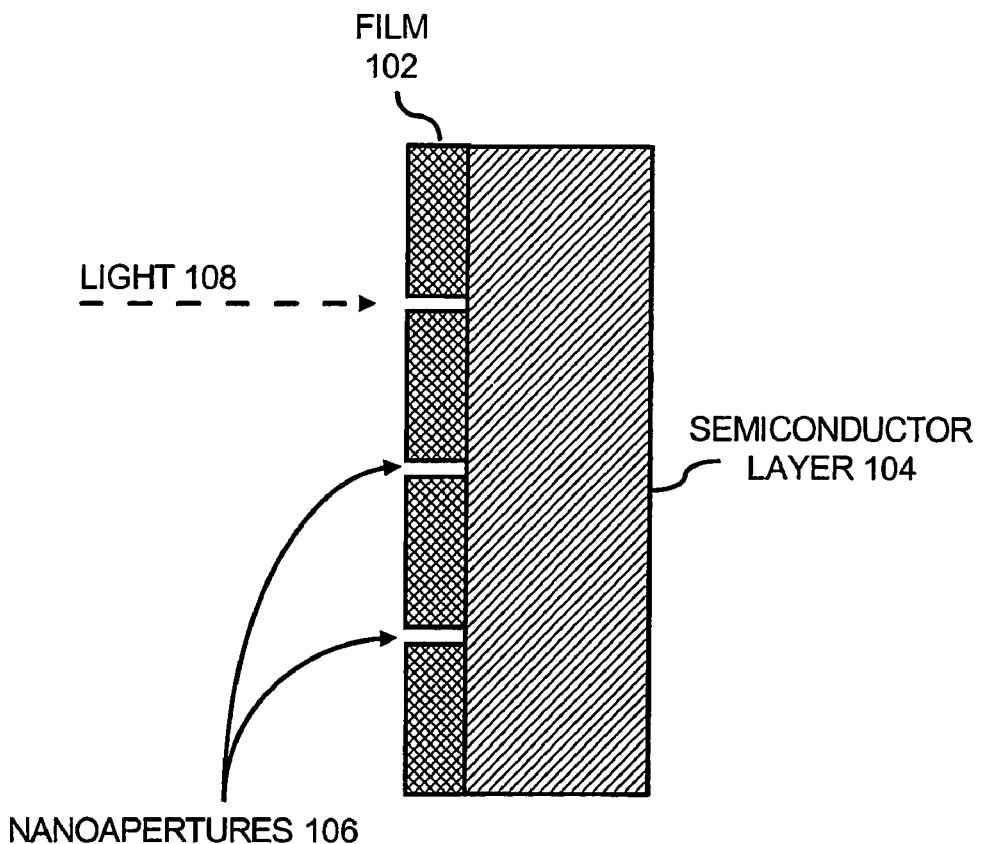
FIG. 1A illustrates a cross-sectional view of a structure having a film with nanoapertures and a semiconductor layer, according to an embodiment.

FIG. 1A illustrates a cross-sectional view of a structure 100 having a film 102 and a semiconductor layer 104, according to an embodiment. The film 102 includes nanoapertures 106, which are openings through the film 102 configured to allow one or more predetermined subwavelengths of light 108 to be transmitted through the film 102. Thus, the nanoapertures 106 act as a filter by blocking the transmission of certain wavelengths of the light 108 through the film 102, while allowing for the transmission of only the predetermined subwavelengths of the light 108. While FIG. 1A depicts two arrows pointing to the nanoapertures 106, it is to be understood that FIG. 1A shows three nanoapertures and that a third arrow is omitted for simplicity. Furthermore, the film 102 may contain less than three or many more nanoapertures than the three shown in FIG. 1A.

As described above, the nanoapertures 106 may be configured to allow a predetermined subwavelength, or narrow band of subwavelengths, of light to pass through the film 102. For example, the nanoapertures 106 may be configured to allow the red spectrum of light ranging from approximately 580 to 680 nm, with a peak transmission wavelength being approximately 627 nm, to be transmitted through the film 102. A person having ordinary skill in the art will appreciate that the nanoapertures 106 may be configured to allow any wavelength, or any band of wavelengths, of light to pass through the film 102.

Configuring the nanoapertures 106 to allow a predetermined subwavelength to pass involves adjusting the periodicity of the nanoapertures 106. Periodicity refers to the spacing between the nanoapertures 106. The wavelength that the nanoapertures 106 are configured to transmit may be directly related to periodicity. This is due, in part, to the generation of standing waves over the surface of the nanoapertures 106, which may be modified by altering periodicity to position the standing waves over the surface of the nanoapertures 106. The diameter and shape of the nanoapertures may also effect the wavelength that the nanoapertures 106 are configured to transmit. For instance, the wavelength that a nanoaperture 106 transmits is generally about ten times larger than the diameter of the nanoaperture 106, as discussed in greater detail below.

The geometric configuration of the nanoapertures 106 is not limited to circular. For instance, the nanoapertures 106 may be circular, oval, elongated slits, rectangular, etc. The nanoapertures 106 may also be patterned, corrugated, have annular rings, etc. For instance, the nanoapertures 106 may be surrounded with concentric circular grooves. Similarly, the nanoapertures 106 may each be configured to allow the same subwavelengths of the light 108 to pass through the film 102 or, alternatively, the film 102 may have nanoapertures 106 configured to allow any number of different subwavelengths of light to pass through the film 102. The nanoapertures 106 may be provided as an array of nanoapertures 106 in the structure 100. The array may be any shape, such as a square array or rectangular array. The nanoapertures 106 may also be provided as multiple arrays. Each array may be configured to allow a single subwavelength of the light 108 to be transmitted through the film 102. For example, each array may be configured to allow a single color spectrum to be transmitted through the film 102, such as red, green, blue, etc. In addition, a single photodetector may have a chirped nanoaperture or a mixture of two or more sets of nanoaperatures that can selectively detect multiple discrete wavelengths. For example, a single photodetector may detect wavelengths at 780 nm and 1550 nm only.

The nanoapertures 106 may have dimensions optimized for detecting a particular subwavelength or optimized for a particular application. For instance, if the nanoapertures 106 are circular, they may have diameters ranging from 10 to 500 nm to detect different subwavelengths. In one embodiment, diameters of 155, 180, and 225 nm may allow for transmission of peak transmission wavelengths of 436, 538, and 627 nm, respectively. The nanoapertures 106 may be empirically configured to be approximately one-tenth the size of the wavelength of the light they are designed to pass. The nanoapertures 106 may be formed by any processes known in the art, including, but not limited to, any form of lithography, such as, electron beam, ion beam, and nanoimprinting lithography.

The film 102 may be formed from conductive materials, such as doped materials such as n- or p-type semiconductor and metals, for example, silver, gold, etc. The film 102 may be formed from a single material or from any combination of materials and may be homogenous or heterogeneous. The film 102 may have any dimensions. For example, in one embodiment, the film 102 may have a maximum thickness of approximately 50 nm. In other examples, the film 102 may have a thickness approximately within a factor of 5 of the diameter of the nanoapertures 106.

The semiconductor layer 104 operates to facilitate the detection of the subwavelengths of the light 108 that are transmitted through the film 102 and may be formed from any semiconductor material or any combination of materials known in the art. For example, the semiconductor layer 104 may be formed from an n-type semiconductor by doping a valence-four semiconductor with valence-five elements in order to increase the number of free (in this case negative) charge carriers or any III-V semiconductors. P-type semiconductor may also be used with appropriate bias, as is known in the art. The semiconductor layer 104 may be joined to the film 102 by any process known in the art, including thermal techniques, electron-beam or chemical deposition of the film 104 on the surface of the semiconductor layer 104.

When the semiconductor layer 104 is connected to the film 102, the transmission spectra of the nanoapertures 106 may be tuned by adjusting the periodicity and symmetry of the film 102 for the dielectric of the semiconductor layer 104, as discussed above. For example, in a square array of nanoapertures 106 with a period of $a_0$ and peak transmissions of $\lambda_{max}$, the normal incidence transmittance spectra can be identified approximately from the dispersion relation given by the following equation:

$$\lambda_{max} = \frac{P}{\sqrt{\frac{4}{3}(i^2 + ij + j^2)}} \sqrt{\frac{\varepsilon_m \varepsilon_d}{\varepsilon_m + \varepsilon_d}}$$

where the indices i and j are the scattering orders from the array and P is the periodicity, or the lattice period, of the array. The dielectric constant of the semiconductor layer 104 may shift the eigen-frequencies by a factor of $f \approx \sqrt{\varepsilon_s}$, where $\varepsilon_s$ is the dielectric constant of the semiconductor material. Therefore, the nanoapertures 106 in the film 102 may be reconfigured to adjust to the effect of the semiconductor layer 104. For example, the nanoapertures 106 may be reduced in size by a factor of f, set forth in the equation above, such that the wavelengths of the light 108 passing through the nanoapertures 106 are shifted to be in resonance with the semiconductor layer 104. Thus, the periodicity and size of the nanoapertures 106 are adjusted to allow for the predetermined subwavelengths of the light 108 to pass through the film 102 into the semiconductor layer 104. For instance, as set forth above, the nanoapertures 106 may be approximately one-tenth the size of the wavelength and the periodicity, such as the number and placement of the nanoapertures 106 in an area, may be modified to determine the wavelength of the light that the nanoapertures 106 will pass. By forming the appropriate period for a standing wave of the surface plasmon, the light is enhanced at the nanoaperture 106 for that wavelength, much as the case for a photonic crystal structure.

Figure 5:
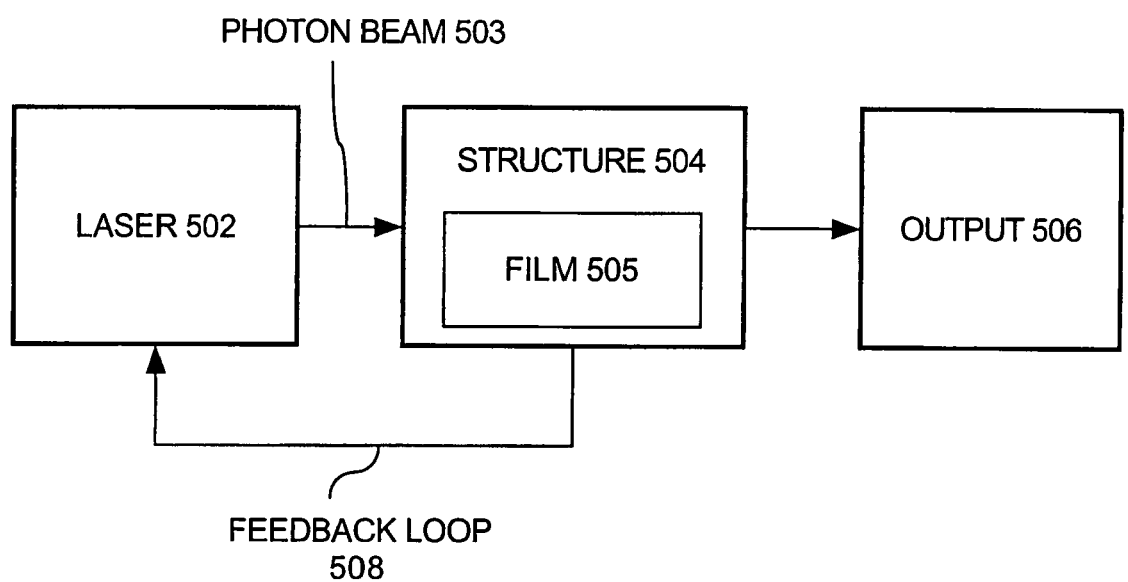
FIG. 5 illustrates a block diagram of a laser application utilizing a structure including a film having nanoapertures, according to an embodiment.

The operation of the structure 100 is as follows. In an embodiment, the structure 100 is part of a photodetector operable to detect a subwavelength or range of subwavelengths of the light 108. For example, the structure 100 may allow for the detection of subwavelengths of 538-588 nm. As FIG. 1A depicts, the light 108 is applied to the structure 100. While FIG. 1A depicts only a single arrow of light 108, it is to be understood that the light 108 may be applied to the entire face of the film 102 to contact each of the nanoapertures 106. The light 108 may originate from any source and may be applied to the structure 100 in any form. One source may include a laser, such as shown in FIG. 5.

When the light 108 comes into contact with the film 102, certain subwavelengths of the light 108, pass through the film 102, via the nanoapertures 106, for example, subwavelengths of 538-588 nm, to the semiconductor layer 104. The subwavelengths of the light 108 passing through the film 102 are predetermined because the nanoapertures 106 are configured to allow only those subwavelengths of light to pass through the nanoapertures 106. Therefore, the nanoapertures 106 will only allow transmission of the specific subwavelengths of the light 108 through the film 102 that the nanoapertures 106 were configured to let pass. In this manner, the structure 100 may act as a photodetector to detect a specific subwavelength of light. When it is determined that the light 108 has reached the semiconductor layer 104, the subwavelength of the light 108 is automatically known, because the nanoapertures 106 are configured to allow only predetermined subwavelengths of light to pass through the film 102 and reach the semiconductor layer 104.

The subwavelengths of the light 108 may pass through the nanoapertures 106 by coupling to surface plasmons on the film 104. Surface plasmons are waves that propagate along the surface of a substrate, usually a metallic substrate or heavily-doped dielectric substrate. Surface plasmons have the ability to interact with light to allow photons of the light to couple to the surface plasmons. Thus, surface plasmons have the unique capacity to confine light to very small dimensions to propagate the light. The transmission of the light 108 through the nanoapertures 106 without coupling to surface plasmons drops off as the fourth power of the ratio of the diameter of the nanoapertures 106 divided by the wavelength of the light 108. However, with surface plasmon modes, if the nanoapertures 106 are arranged in an array where the period of the array is half the wavelength of the surface plasmon mode, a standing wave is formed and light is enhanced at the nanoaperture 106, thereby allowing enhanced transmission through the nanoapertures 106. In this manner, the subwavelengths of the light 108 may pass through the film 102 by coupling to surface plasmons in the nanoapertures 106.

The structure 100, depicted in FIG. 1, may also include multiple semiconductor layers. For example, the structure 100 may include an intermediate semiconductor layer (not shown) disposed between the film 102 and the semiconductor layer 104. The intermediate semiconductor layer may have a higher bandgap than the bandgap of the semiconductor layer 104 and may be used for tuning the nanoapertures 106 by altering the subwavelength of the light 108 that the nanoapertures 106 are configured to allow transmission of. The nanoapertures 106 may be tuned, for example, by current injection. Embodiments having multiple semiconductor layers may be used in conjunction with a photodiode, such as a p-i-n semiconductor junction, where p is a p-type semiconductor, i is an intrinsic or not intentionally doped semiconductor, and n is an n-type semiconductor, as is known in the art. In this embodiment, nanoapertures may be formed in the p or n layer to act as a subwavelength filter, similar to the film 102. However, in this embodiment, the nanoapertures may also filter infrared frequencies.

Figure 1B:
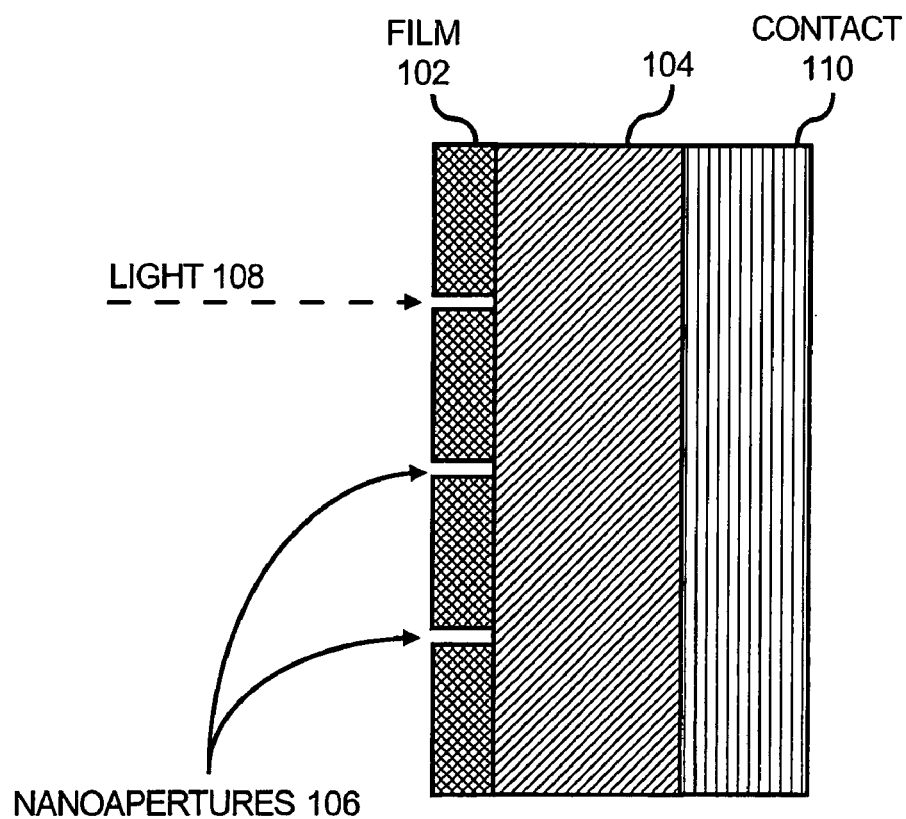
FIG. 1B illustrates a cross-sectional view of a structure having a film with nanoapertures, a semiconductor layer, and a contact, according to an embodiment.

FIG. 1B illustrates a cross-sectional view of a structure 112 having a film 102, a semiconductor layer 104, and a contact 110, according to an embodiment. The film 102 and the semiconductor layer 104 may be substantially similar, or identical, to the film 102 and the semiconductor layer 104, described above with respect to FIG. 1A. The contact 110 may be an ohmic contact or a region on the structure 200 that has been prepared so that the current-voltage (I-V) curve of the structure 200 is linear and symmetric. That is, the contact 110 may be a metallic material that creates an ohmic metal-semiconductor junction that does not rectify current. In other examples, the contact 110 may be formed from a transparent indium tin oxide (ITO) material. While FIG. 1B depicts the contact 110 in connection with an entire surface of the semiconductor layer 104, a person having ordinary skill in the art will appreciate that the contact 110 may be in connection with a partial surface of the semiconductor layer 104. When the predetermined subwavelengths of the light 108 having photon energy exceeding the (direct) bandgap of the semiconductor layer 104 are transmitted through the nanoapertures 106, electron-hole pairs are created in the semiconductor layer 104 and absorb incident photons from the predetermined above bandgap light 108 which in this case is reverse-biased to sweep the electrons into the contact 110, resulting in a photocurrent in the external circuit. This photocurrent may be detected to determine that the light 108 has reached the semiconductor layer 104. The subwavelength of the above bandgap light 108 is automatically known when it is determined that the light 108 has reached the semiconductor layer 104, because the nanoapertures 106 are configured to allow only those subwavelengths of the light 108 to be transmitted through the film 102, as described above. Any suitable materials and processes known in the art for creating an ohmic contact may be used to create the contact 110. For example, the contact 110 may be a sputtered or evaporated metallic pad that is patterned using photolithography.

Although not illustrated in FIG. 1B, the structure 112 may also include a measuring device for detecting and/or reading the photocurrent created in the structure 112. For example, the measuring device may include an ampere meter connected to the contact 110 to detect a change in current responsive to the generation of the photocurrent in the semiconductor layer 104 due to the transmission of the light 108 through the nanoapertures 106. In another embodiment, a voltmeter may be used to measure the change in voltage across a load resistor due to the photocurrent generated in the semiconductor layer 104.

Figure 2:
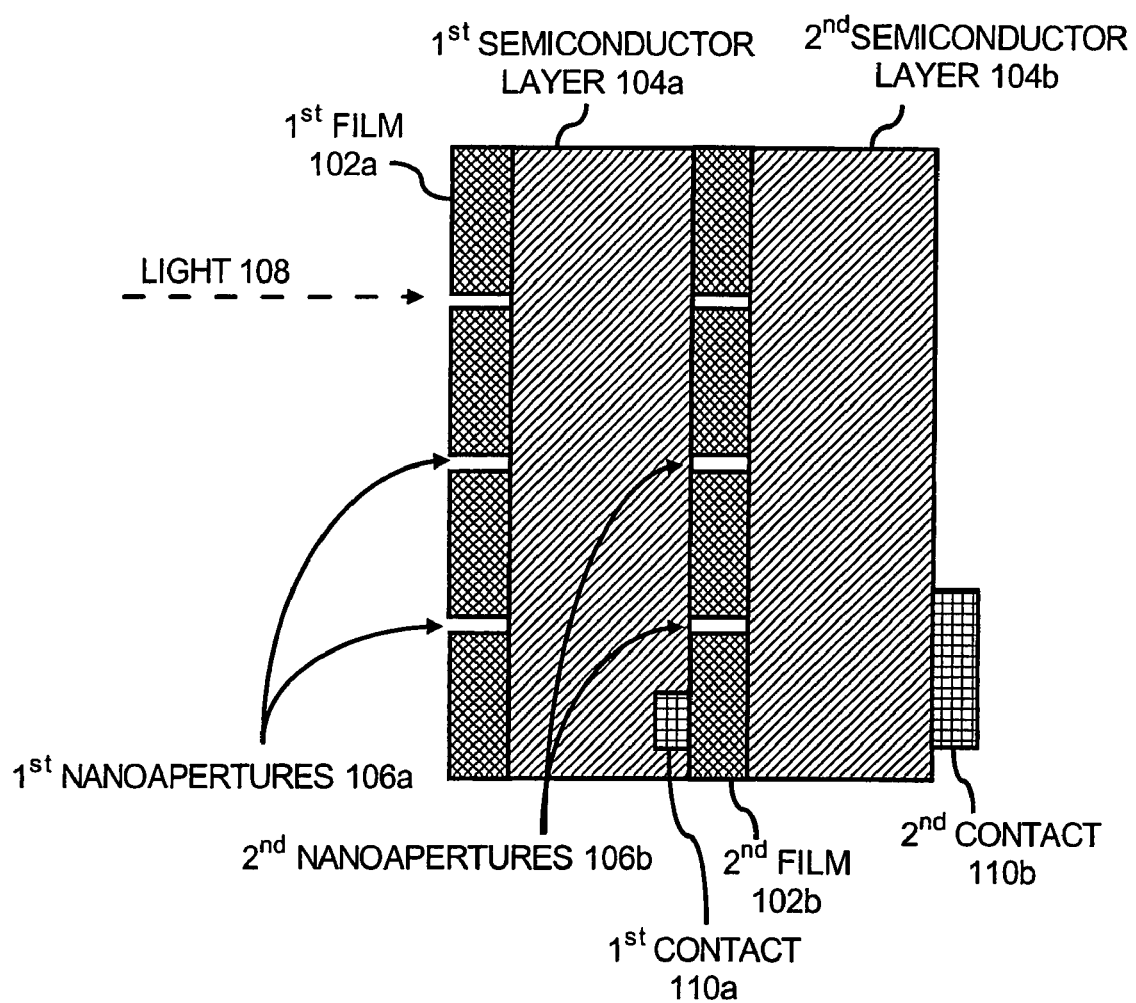
FIG. 2 illustrates a cross-sectional view of a structure having multiple films and semiconductor layers arranged in series, according to an embodiment.

FIG. 2 illustrates a cross-sectional view of a structure 200, according to an embodiment. The structure 200 includes a first film 102*a* having first nanoapertures 106*a*, a first semiconductor layer 104*a*, and a first contact 110*a*, which may be substantially similar to the structure 112, depicted in FIG. 1B. The structure 200 also includes a second film 104*b* having second nanoapertures 106*b*, a second semiconductor layer 104*b*, and a second contact 110*b*, which also may be substantially similar to the structure 110. Therefore, the structure 200 may be, essentially, the structure 112 arranged in series with another structure 100. The first contact 110a is depicted as being smaller than the second contact 110b, such that the first contact 110a does not obstruct the light 108 from passing through the second film 102b. However, the first and second contacts 110a and 110b may be any reasonably suitable size so long as the first contact 110a does not obstruct the second nanoapertures 106b. The first contact 110a is shown in FIG. 2 as embedded in the first semiconductor layer. In this example, the first semiconductor layer 104a may contain vias to allow a measuring device to access the first contact 110a. In other examples, the first contact 110a may not be embedded in the first semiconductor layer 104a, but may be connected to an outer region of the first semiconductor layer 104a.

The use of multiple films arranged in series, as shown in FIG. 2, allows light to be, not only detected, but analyzed. For instance, the light 108 is applied to the first film 102a and the first nanoapertures 106a are configured to allow predetermined subwavelengths of the light 108 to be transmitted through the first film 102a. The transmitted subwavelengths of the light 108 may pass through the first semiconductor layer 104a and into the second film 102b.

In one embodiment, the first nanoapertures 106a of the first film 102a are configured to transmit different subwavelengths of the light 108 than the second nanoapertures 106b of the second film 102a. For example, the first nanoapertures 106a may be configured to transmit a light of approximately 436 nm, while the second nanoapertures 106b are configured to transmit a light of approximately 538 nm. The first semiconductor layer 104a and the second semiconductor layer 104b may have different bandgaps. Thus, the structure 200 may be configured to detect different subwavelengths of the light 108.

In the example described above, the 436 nm light 108 would normally not be detected at the second semiconductor layer 104b, because the first and second nanoapertures 106a and 106b are configured to transmit different subwavelengths of the light 108. That is, a 436 nm light is transmitted through the first film 102a via the first nanoapertures 106a, but cannot pass through the second nanoapertures 106b of the second film 102b because the second nanoapertures 106b are configured to pass a 538 nm subwavelength. Therefore, the 436 nm subwavelength is blocked by the second film 102b.

However, the first film 102a may be associated with a contaminant, such as a biological or chemical substance. For example, an organic molecule may bind to the metallic surface of the first film 102a. This interaction between the organic molecule and the first film 102a may modify the resonance of the first film 102a, leading to a shift in the transmission subwavelength of the first nanoapertures 106a. For instance, the organic molecule may modify the resonance of the first film 102a by altering the dimensions of the first nanoapertures 106a. This shift may cause the first nanoapertures 106a to allow transmission of a different subwavelength of the light 108 than the first nanoapertures 106a were originally configured to allow transmission of. Thus, if the first nanoapertures 106a were originally configured to allow transmission of a subwavelength of approximately 436 nm, the contaminant interacting with the first film 102a may cause the first nanoapertures 106a to allow transmission of a subwavelength of 538 nm. Therefore, in this example, the 536 nm subwavelength of the light 108 is transmitted through both the first and second films 102a and 102b. Detection of the light 108 at the second semiconductor layer 104b provides a determination that a contaminant is interacting with the first film 102a.

In this manner, the first film 102a functions as a detector, while the second film 102b functions as an analytical filter. The first film 102a detects the presence of the contaminant by either blocking the transmission of the 536 nm subwavelength of the light 108, described in the example above, or transmitting a shifted subwavelength of the 536 nm light 108. The second film 102b may analyze the shift in the light 108 by allowing for the transmission of the shifted light 108 to the second semiconductor layer 104b, thereby providing a determination of what the subwavelength of the light 108 has been shifted to. Knowing the shifted light 108 may provide for the identification of the contaminant. For example, a shift from 436 nm to 538 nm may suggest that the organic molecule causing the shift is a particular DNA molecule. Alternatively, if the 538 nm light is not detected at the second semiconductor layer 104b, then a determination is provided that the contaminant is not associated with the first film 102a. Thus, the structure 200 operates as a detector operable to detect a contaminant associated with a film.

A person having ordinary skill in the art will appreciate that while examples of specific subwavelengths are recited above to describe various embodiments, that the first and second nanoapertures 106a and 106b may be configured to allow transmission of any light 108. Similarly, differently configured nanoapertures may be used in any combination in the first and second films 102a and 102b. For instance, the first nanoapertures 106a may be configured to transmit a specific narrow band of subwavelengths, while the second nanoapertures 106b are configured to transmit multiple different narrow bands of subwavelengths.

Figure 3:
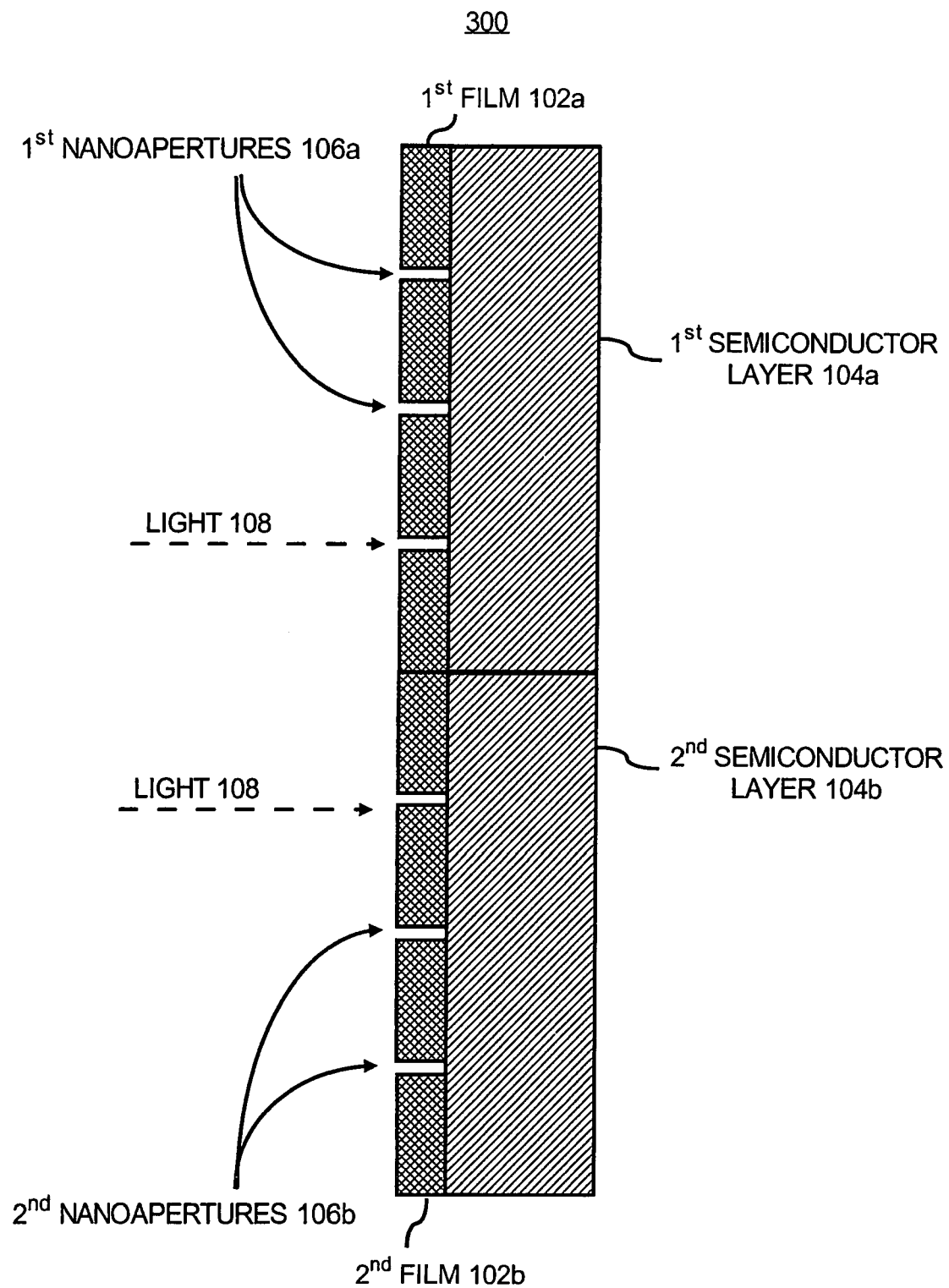
FIG. 3 illustrates a cross-sectional view of a structure having multiple films and semiconductor layers arranged in parallel, according to an embodiment.

FIG. 3 illustrates a cross-sectional view of a structure 300, according to an embodiment. The structure 300 includes a first film 102a having first nanoapertures 106a and a first semiconductor layer 104a, which may be substantially similar to the film 102 and the semiconductor layer 104 of the structure 100, depicted in FIG. 1. The structure 300 also includes a second film 104b having second nanoapertures 106b and a second semiconductor layer 104b, which also may be substantially similar to the structure 100. Therefore, the structure 300 may be, essentially, the structure 100 arranged in parallel with another structure 100. Although not illustrated, the structure 300 may also contain first and second contacts 110a and 110b, substantially similar to the first and second contacts 110a and 110b depicted in FIG. 2.

The use of multiple films arranged in parallel in the structure 300 allows for the capture of a broader range of spectral information. For example, the first nanoapertures 106a of the first film 102a may be configured to transmit a predetermined subwavelength of the light 108 while the second nanoapertures 106b of the second film 102b are configured to transmit different predetermined subwavelengths of the light 108. The combination of the two different films allows for more spectral information to be obtained, because the structure 300 is operable to detect multiple different wavelengths.

Although not illustrated, the structure 300 may also include additional films and semiconductor layers arranged in series with the structure 300. For instance, in an embodiment, the structure 300 may resemble the structure 200, depicted in FIG. 2. That is, the structure 300 may have multiple films arranged in series, where the multiple films act as detectors and analyzers, as set forth above.

Figure 4:
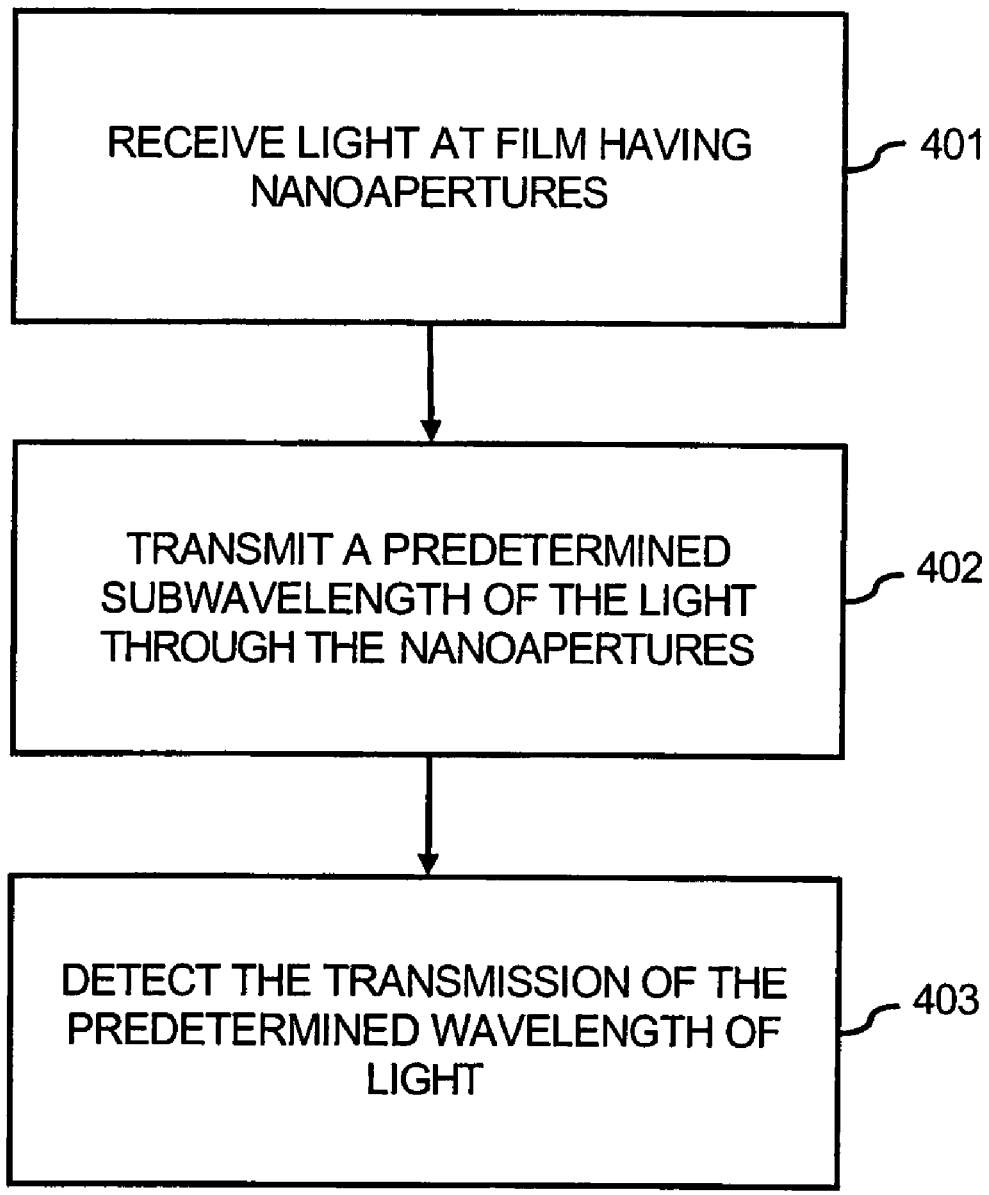
FIG. 4 illustrates a flow chart of a method for detecting a wavelength of light, according to an embodiment.

FIG. 4 illustrates a flow chart of a method 400 for detecting a subwavelength or subwavelengths of light, according to an embodiment. For example, the method 400 may be used in conjunction with the structure 100, illustrated in FIG. 1A to detect a predetermined wavelength of the light 108. The method 400 is described with respect to FIGS. 1-3, by way of example and not of limitation. A person having ordinary skill in the art will appreciate that additional steps may be added to the method 400 and, similarly, that some of the steps outlined in FIG. 4 may be omitted, changed, or rearranged without departing from a scope of the method 400.

At step 401, light is received. For example, the light 108 is received at a film 102 having a plurality of nanoapertures 106. The film 102 may have any number of nanoapertures 106 configured to detect any different number of wavelengths of the light 108, including a single wavelength or a range of wavelengths. The film 102 may also include multiple films arranged either in series or in parallel, as depicted in FIGS. 2 and 3, respectively. The film 102 may be associated with a semiconductor layer 104.

At step 402, a predetermined wavelength of the light 108 is transmitted through the film 102 via at least one of the plurality of nanoapertures 106 to the semiconductor layer 104 connected to the film 102.

At step 403, the predetermined wavelength of the light 108 transmitted through the film 102 via the nanoapertures 106 is detected. When the light 108 is detected, the wavelength of the light 108 may be automatically determined, as described above. Although not illustrated in FIG. 4, the method 400 may also be practiced with a structure having a contact 110, such as the structure 112 depicted in FIG. 1B. The contact 110 may be an ohmic contact, for example, and may create a Schottky junction between the semiconductor-contact interface. The creation of the Schottky junction may facilitate detection of the predetermined wavelength of the light 108 transmitted through the film 102, because transmission of the light 108 may cause a photocurrent to flow from the semiconductor layer 104 to the contact 110. This photocurrent may be detected, thereby providing a determination that the predetermined wavelength of the light 108 has been transmitted through the nanoapertures 106.

The structures described herein may be useful in a variety of different applications. For instance, the structures may be used in information processing, sensors, and in laser data transmission applications. FIG. 5 illustrates a block diagram 500 of a laser application utilizing the structures described herein. The block diagram 500 includes a laser 502, a structure 504, and an output 506. The laser 502 may be any optical source that emits photons in a coherent beam, such as a surface-emitting laser. The photon beam 503 emitted from the laser 502 may be fed into the structure 504, which includes a film 505 having nanoapertures. The structure 504 may include one or more of the structures 100, 112, 200, or 300, depicted in FIGS. 1A, 1B, 2, and 3.

Feeding the photons from the laser 502 into the structure 504 may serve at least two purposes. The film 505 of the structure 504 may serve to further refine the photon beam 503. For instance, the photon beam 503 may be refined by being narrowed to a predetermined wavelength of light. The photon beam 503 emitted from the laser 502 may consist of a relatively wide range of wavelengths. However, the nanoapertures of the film 505 may block many of those wavelengths and only allow a predetermined wavelength to be transmitted through the structure 504. Thus, in this example, the output 506 is a predetermined wavelength of light. In this manner, the structure 504 is operable to further refine the photon beam 503 of the laser 502.

In another embodiment, the structure 504 may provide a feedback loop 508 to the laser 502. In this embodiment, the structure 504 may transmit data in the feedback loop 508 back to the laser 502 to inform the laser 502 of the wavelength of the photon beam 503. That is, the structure 504 may indicate whether or not a predetermined wavelength of light is being transmitted from the laser 502. The laser 502 may utilize this data to adjust the photon beam 503.

While the embodiments have been described with reference to examples, those skilled in the art will be able to make various modifications to the described embodiments. The terms and descriptions used herein are set forth by way of illustration only and are not meant as limitations. In particular, although the methods have been described by examples, steps of the methods may be performed in different orders than illustrated or simultaneously. Those skilled in the art will recognize that these and other variations are possible within the spirit and scope as defined in the following claims and their equivalents.

What is claimed is:

1. A structure comprising:
   a film having a plurality of nanoapertures configured to allow the transmission of a predetermined subwavelength of light through the film via the nanoapertures;
   a semiconductor layer in connection with the film to facilitate detection of the predetermined subwavelength of the light transmitted through the film; and
   a laser connected to the semiconductor layer, wherein the laser is configured to adjust a subwavelength of light output by the laser based on whether the predetermined subwavelength of light is detected via the semiconductor layer.

2. The structure of claim 1, wherein the film is a metallic film.

3. The structure of claim 2, wherein the metallic film is part of a Schottky barrier.

4. The structure of claim 1, wherein the semiconductor layer includes an n-type semiconductor.

5. The structure of claim 1, wherein the film is configured to allow the predetermined wavelength of light to couple to surface plasmons in the film.

6. The structure of claim 1, wherein the plurality of nanoapertures have an Eigen-frequency which is shifted by a factor of f depending on the dielectric constant of their environment.

7. The structure of claim 1, wherein the predetermined subwavelength of light is transmitted through the plurality of nanoapertures to generate a flow of electrons into the semiconductor layer.

8. The structure of claim 1, further comprising:
   a contact in connection with the semiconductor layer to facilitate detecting a photocurrent generated in the semiconductor layer in response to the predetermined subwavelength of light being transmitted through the film and contacting the semiconductor layer.

9. A structure comprising:
   a film having a plurality of nanoapertures configured to allow the transmission of a predetermined subwavelength of light through the film via the nanoapertures; and
   a semiconductor layer in connection with the film to facilitate detection of the predetermined subwavelength of the light transmitted through the film,
   wherein the film is part of a p-i-n photodiode and the nanoapertures are fabricated on a portion of the p or n layer for filtering light having a wavelength ranging from approximately 1000-2000 nm.

10. A photodetector comprising:
    a plurality of films, wherein each of the plurality of films includes nanoapertures configured to allow the transmission of predetermined subwavelengths of light through the nanoapertures; and a semiconductor layer in connection with the plurality of films to facilitate detection of the predetermined subwavelength of the light transmitted through the film.

11. The photodetector of claim 10, wherein the plurality of films are arranged in parallel to one another.

12. The photodetector of claim 10, wherein the plurality of films are arranged in series to one another.

13. The photodetector of claim 10, wherein the nanoapertures of the each of the plurality of films is configured to allow the transmission of a different predetermined subwavelength of light through the nanoapertures.

14. The photodetector of claim 10, wherein at least one of the plurality of films is configured to detect a contaminant.

15. The photodetector of claim 14, wherein the contaminant is a biological or chemical substance interacting with the at least one of the plurality of films.

16. The photodetector of claim 10, wherein at least some of the nanoapertures have an Eigen-frequency which is shifted by a factor of f depending on the dielectric constant of their environment.

* * * * *